US006846617B2

(12) United States Patent
Pierrat (10) Patent No.: US 6,846,617 B2
(45) Date of Patent: Jan. 25, 2005

(54) FACILITATING OPTICAL PROXIMITY EFFECT CORRECTION THROUGH PUPIL FILTERING

(75) Inventor: Christophe Pierrat, Santa Clara, CA (US)

(73) Assignee: Numerical Technologies, San Jose, CA (US)

( * ) Notice: Subject to any disclaimer, the term of this patent is extended or adjusted under 35 U.S.C. 154(b) by 225 days.

(21) Appl. No.: 10/146,274

(22) Filed: May 15, 2002

(65) Prior Publication Data

US 2003/0215616 A1 Nov. 20, 2003

(51) Int. Cl.⁷ ............................................. G03B 27/14
(52) U.S. Cl. ..................... 430/311; 430/396; 430/5; 430/313; 355/53; 355/71
(58) Field of Search ................. 430/311, 396, 430/5, 313; 355/53, 71

(56) References Cited

U.S. PATENT DOCUMENTS

| | | | |
|---|---|---|---|
| 5,144,362 A | | 9/1992 | Kamon et al. ................. 355/53 |
| 5,863,712 A | * | 1/1999 | Von Bunau et al. ........ 430/396 |
| 2002/0001758 A1 | * | 1/2002 | Petersen et al. ............... 430/5 |

OTHER PUBLICATIONS

Sewell, H., et al., "Aberration Control for Advanced Step–and–Scan Systems Using Pupil Plane Engineering", Optical Microlithography XIV Proceeding of SPIE, vol. 4346, pp. 585–594 (2001).
Publication entitled "Optimum combination of source, mask and filter for better lithographic performance," by Hye–Keun Oh et al., SPIE Procedings, vol. 2440. pp. 838–849.
Book entitled "Introduction to Fourier Optics", by Joseph W. Goodman. McGraw Hill. Boston, Massachusetts, pp. 150–155.

* cited by examiner

Primary Examiner—John A. McPherson
Assistant Examiner—Daborah Chacko-Davis
(74) Attorney, Agent, or Firm—Park, Vaughan & Fleming, LLP (57) ABSTRACT

One embodiment of the invention provides a system that uses pupil filtering to mitigate optical proximity effects that arise during an optical lithography process for manufacturing an integrated circuit. During operation, the system applies a photoresist layer to a wafer and then exposes the photoresist layer through a mask. During this exposure process, the system performs pupil filtering, wherein the pupil filtering corrects for optical proximity effects caused by an optical system used to expose the photoresist layer.

31 Claims, 9 Drawing Sheets

FACILITATING OPTICAL PROXIMITY EFFECT CORRECTION THROUGH PUPIL FILTERING

BACKGROUND

1. Field of the Invention

The invention relates to the process of manufacturing an integrated circuit. More specifically, the invention relates to a method and an apparatus for using pupil filtering to mitigate optical proximity effects that arise during an optical lithography process used in manufacturing an integrated circuit.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise during the optical lithography processes that are used to manufacture integrated circuits. This optical lithography process generally begins with the formation of a photoresist layer on the surface of a semiconductor wafer. A mask composed of opaque regions, which are generally formed of chrome, and light-transmissive clear regions, which are generally formed of quartz, is then positioned over this photo resist layer coated wafer. (Note that the term "mask" as used in this specification is meant to include the term "reticle.") Light is then shone on the mask from a visible light source or an ultraviolet light source.

This light is generally reduced and focused through an optical system that contains a number of lenses, filters and mirrors. The light passes through the clear regions of the mask and exposes the underlying photoresist layer. At the same time, the light is blocked by opaque regions of mask, leaving underlying portions of the photoresist layer unexposed.

The exposed photoresist layer is then developed, typically through chemical removal of the exposed/non-exposed regions of the photoresist layer. The end result is a semiconductor wafer with a photoresist layer having a desired pattern. This pattern can then be used for etching/implanting on underlying regions of the wafer.

Phase shifters are often incorporated into a mask in order to achieve line widths that are smaller than the wavelength of the light that is used to expose the photoresist layer through the mask. During phase shifting, destructive interference caused by two adjacent clear areas on a mask is used to create an unexposed area on the photoresist layer. This is accomplished by exploiting the fact that light passing through a mask's clear regions exhibits a wave characteristic having a phase that is a function of the distance the light travels through the mask material. By placing two clear areas adjacent to each other on the mask, one of thickness $t_1$ and the other of thickness $t_2$, one can obtain a desired unexposed area on the underlying photoresist layer caused by interference. By varying the thickness ti and $t_2$ appropriately, the light exiting the material of thickness $t_2$ is 180 degrees out of phase with the light exiting the material of thickness $t_1$. Phase shifting is described in more detail in U.S. Pat. No. 5,858,580, entitled "Phase Shifting Circuit Manufacture Method and Apparatus," by inventors Yao-Ting Wang and Yagyensh C. Pati, filed Sep. 17, 1997 and issued Jan. 12, 1999.

Figure 1:
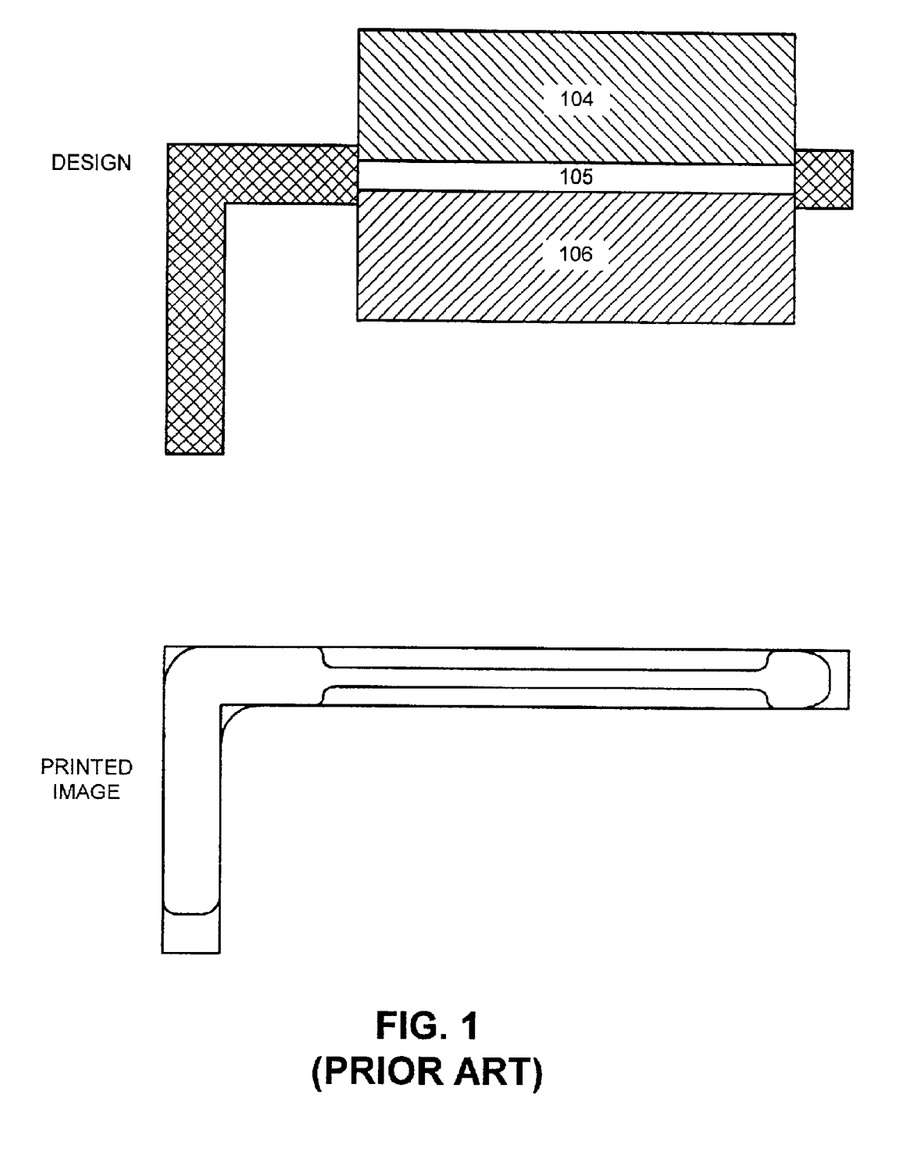
FIG. 1 illustrates the use of a phase shifter to define a transistor gate.

For example, FIG. 1 illustrates how a phase shifter comprised of a zero-degree clear region (phase shifting region 104) and a 180-degree clear region (phase shifting region 106) separated by a chromium regulator 105 is used to achieve a smaller line width for a gate region of a transistor. Note that FIG. 1 does not show masks, but rather a composite layout showing the resultant design and the phase shift areas. In order to produce these features, two masks are generally used: one dark field mask with the phase shifters; and the other a complementary trim mask with protection for regions defined by the phase shifting mask and to define cross-hatched areas. Furthermore, note that as circuit dimensions on semiconductor chips become progressively smaller, phase shifters can be used to define other critical-dimension features in addition to transistor gates.

Unfortunately, the printed image that results from the above-described process is subject to proximity effects that can cause edges of features to deviate from desired locations. Some of these proximity effects are caused by the optical system that is used to expose the photoresist layer.

Note that in order to take advantage of phase shifting masks, coherent illumination (with low σ) needs to be used. This coherent illumination is the reason for large proximity effects (see [Pierrat 2000] "Investigation of Proximity Effects in Alternating Aperture Phase Shifting Masks", by C. Pierrat, $20^{th}$ Annual BACUS Symposium on Photomask Technology, 13–25 September 2000, Monterey, Calif.).

For σ=0, the image on the wafer is equal to the convolution of the mask amplitude by the point-spread function of the optics. In other words, the spatial frequency spectrum of the mask is multiplied by the pupil function of the optics to obtain the spatial frequency spectrum of on the wafer.

Figure 2A:
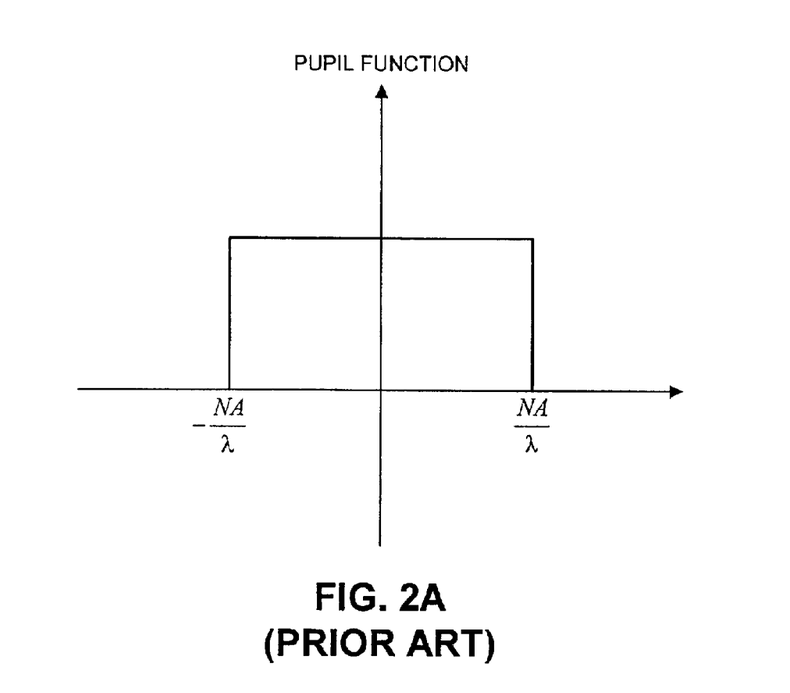
FIG. 2A illustrates a pupil function for an optical system.

FIG. 2A illustrates an idealized "pupil function" for an optical system that uses a coherent light source to project an image of the mask onto the photoresist layer. Because of physical limitations of the optical system, this pupil function cuts off all spatial frequency components greater than NA/λ or less than –NA/λ, where NA is the numerical aperture of the optical system, and where λ is the wavelength of the coherent light source.

Figure 2B:
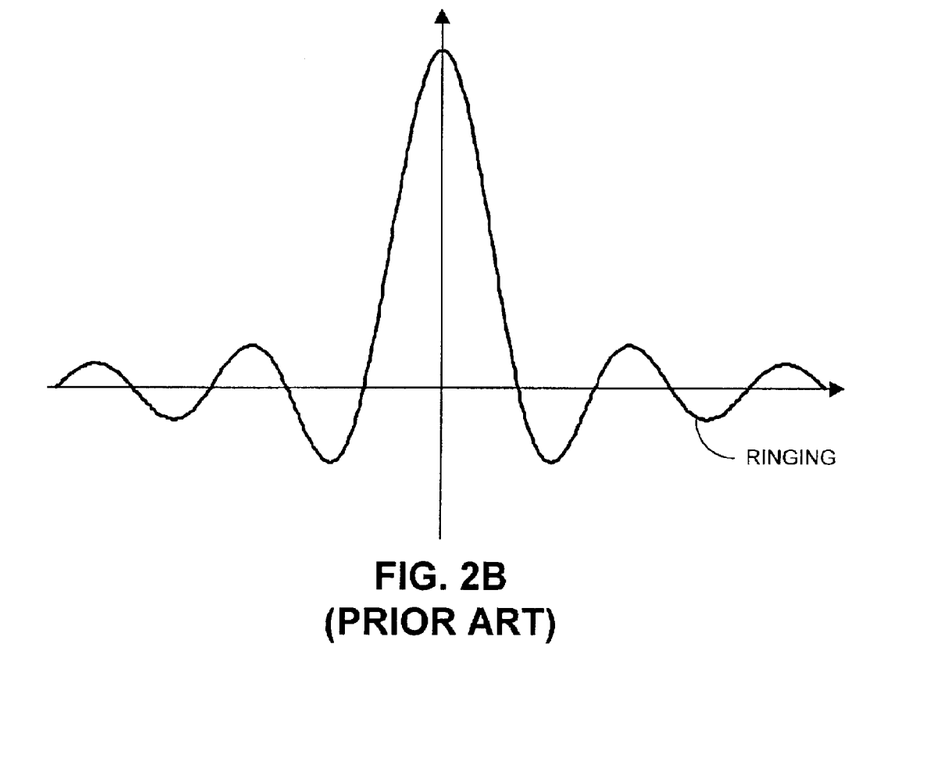
FIG. 2B illustrates a corresponding point-spread function for the pupil function.

The resulting point-spread function for this pupil function (illustrated in FIG. 2B) can be determined by taking the Fourier transform of the pupil function. This point-spread function illustrates how the image of one point is spread by the optical system. Note that ringing arises in the point-spread function because the pupil functions sharply cuts off higher frequency components. This ringing a major factor in causing undesired optical proximity effects (see [Pierrat 2000]).

These optical proximity effects can be corrected, or at least compensated for, by adjusting the width of the chromium regulator 105 between phase shifting regions 104 and 106. However, as integration densities continue to decrease, even reducing the width of the chromium regulator to zero may not provide sufficient correction (see [Pierrat 2000]).

Proximity effects can also be corrected by varying the shifter width. However, shifter width cannot be made too small because of mask fabrication issues (resolution and overlay) and wafer process latitude issues. Moreover, the shifter width cannot be made too large without increasing the risk of phase conflicts. See also U.S. patent application Ser. No. 10/082,697 filed Feb. 25, 2002, entitled "Optical Proximity Correction For Phase Shifting Photolithographic Masks", having inventors Christophe Pierrat and Michel Côté and assigned to the assignee of this application, for a discussion of OPC techniques for phase shifting masks.

Proximity effects can also be corrected by adding assist features (e.g., hammerheads or serifs) to shapes within a layout to compensate for optical effects.

Note that the correction techniques described above rely on modifying the mask layout. The main problems with these techniques is either: (1) their efficacy (chrome regulator width); (2) their practicality (shifter width); or (3) their complexity from a mask and layout standpoint (assist features).

Hence, what is needed is a method and an apparatus for correcting optical proximity effects that addresses the root cause of the optical proximity effects—the sharp cut-off of the pupil function—without the problems of the above-described techniques.

SUMMARY

One embodiment of the invention provides a system that uses pupil filtering to mitigate optical proximity effects that arise during an optical lithography process for manufacturing an integrated circuit. During operation, the system applies a photoresist layer to a wafer and then exposes the photoresist layer through a mask. During this exposure process, the system performs pupil filtering, wherein the pupil filtering corrects for optical proximity effects caused by an optical system used to expose the photoresist layer.

In a variation on this embodiment, the pupil filtering introduces attenuation into a pupil of the optical system that is used to expose the photoresist layer. This attenuation varies radially from the center of the pupil to provide proximity effect correction for a printed image on the wafer.

In a variation on this embodiment, the attenuation increases with radial distance from the center of the pupil. In a further variation, the attenuation achieves a Gaussian intensity apodization.

In a variation on this embodiment, the pupil filtering introduces phase variations into the pupil of an optical system that is used to expose the photoresist layer.

In a variation on this embodiment, the pupil filtering is accomplished by using a concentric ring that filters light surrounding the center of the pupil. This concentric ring can cancel out ringing effects caused by edges of the pupil.

In a variation on this embodiment, the pupil filtering additionally compensates for resist effects or etch effects.

In a variation on this embodiment, the exposure is part of an alternating aperture phase shift mask (PSM) process for manufacturing the integrated circuit.

DETAILED DESCRIPTION

Optical System

Figure 3:
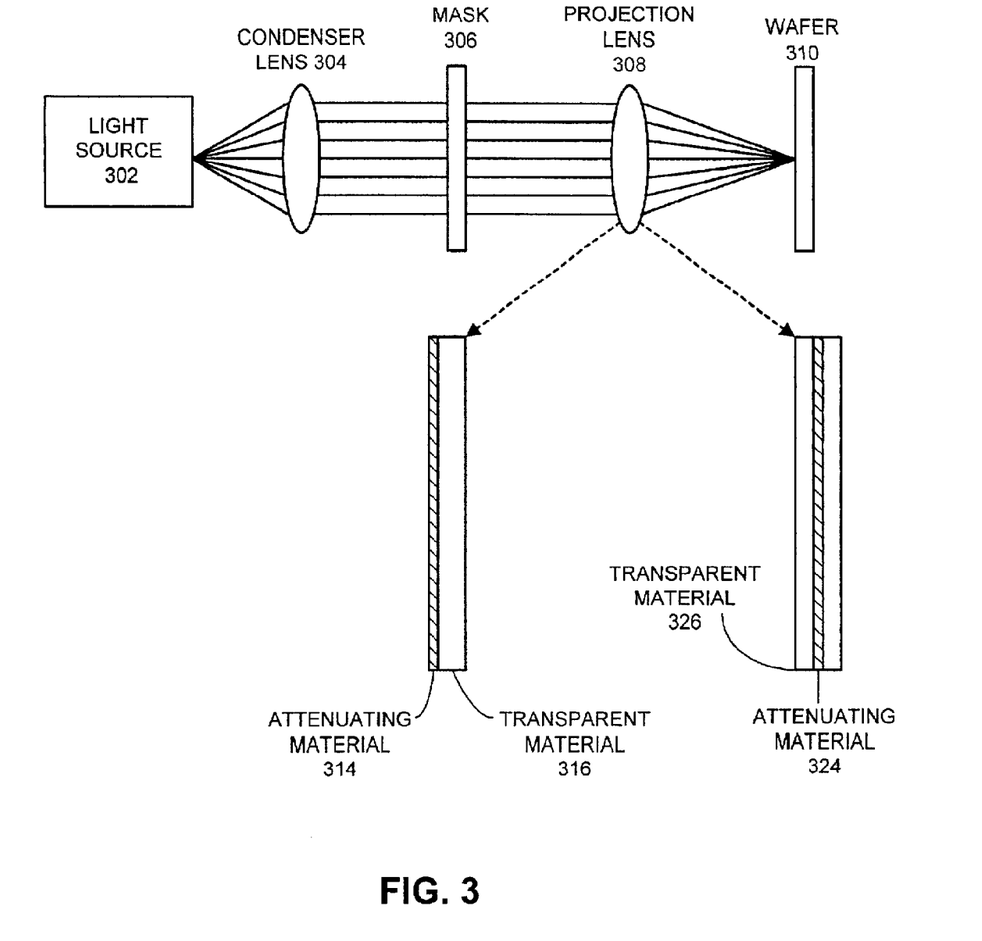
FIG. 3 illustrates an optical system including a pupil filter in accordance with an embodiment of the invention.

FIG. 3 illustrates an optical system including a pupil filter in accordance with an embodiment of the invention. As shown in FIG. 3, radiation emanates from light source 302, which can be any suitable source of radiation such as a laser. This radiation passes through condenser lens 304, and then through mask 306. Mask 306 defines circuit patterns to be projected onto wafer 310. The image of mask 306 passes through projection lens 308, which directs the image onto wafer 310. Wafer 310 is a semiconductor wafer treated with a photoresist layer, or more generally any item to be exposed by the system. During operation, the above-described system transfers the circuitry defined by mask 306 onto wafer 310.

Note that projection lens 308 can include a series of lenses, one or more lenses that perform pupil filtering. As is illustrated in the left-hand example in FIG. 3, a lens that performs pupil filtering can include a transparent material 316 that makes up the lens, such as quartz or calcium fluoride, as well as an attenuating material 314 bonded to the side of the lens that introduces attenuation (or possibly phase variations) into light passing through the filter. This attenuation has a pattern that varies radially from the center of the lens to the edge of the lens. Alternatively, the attenuating material 324 can be located in the middle the transparent material 326 as is illustrated in the right-hand example in FIG. 3.

Variants of such pupil filters are described in more detail below with reference to FIGS. 4–6.

Gaussian Pupil Filter

Figure 4A:
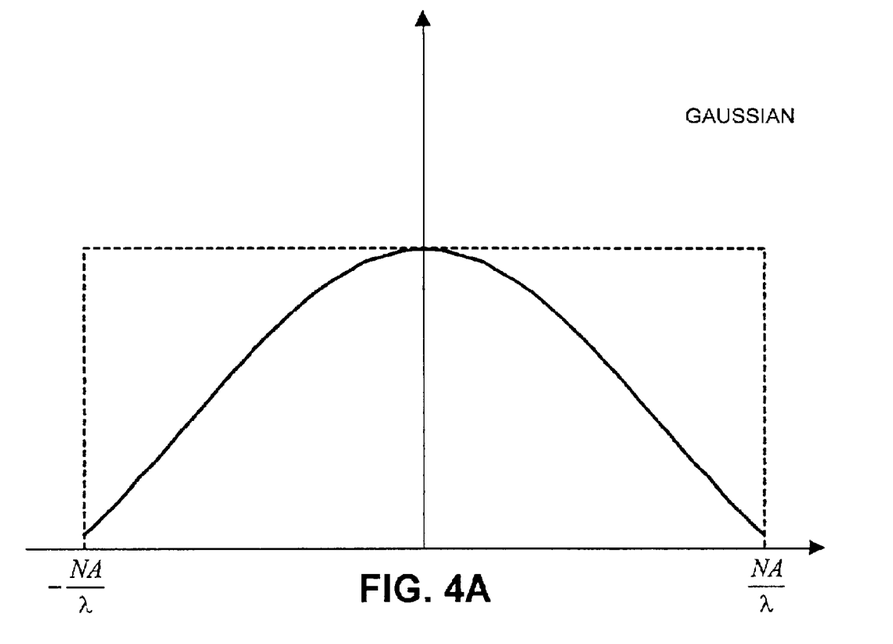
FIG. 4A illustrates a Gaussian pupil function for a pupil filter in accordance with an embodiment of the invention.
Figure 4B:
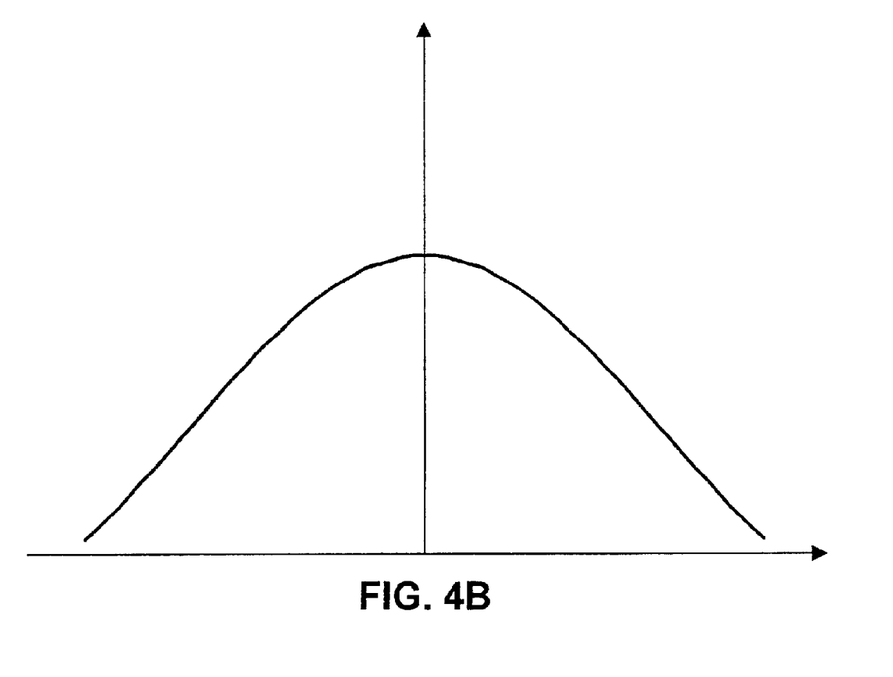
FIG. 4B illustrates a corresponding point-spread function for the pupil filter in accordance with an embodiment of the invention.

FIG. 4A illustrates a pupil filter that provides a Gaussian apodization in accordance with an embodiment of the invention. This Gaussian apodization can be accomplished by introducing attenuation into the pupil of the imaging system. Note that this attenuation is insignificant at the center of the pupil, but increases with distance away from the center following a Gaussian function.

More specifically, the intensity profile will follow a Gaussian distribution, but the function will be zero outside the pupil ($\pm NA/\lambda$) (see FIG. 4A).

The Fourier transform of a Gaussian function is also a Gaussian function. For example, consider the Gaussian function, $$f(x) = \exp\left(\frac{-x^2}{\sigma^2}\right).$$

The Fourier transform of this function is, $$F(u) = \sigma^2 \exp(-\pi^2 u^2 \sigma^2),$$

which is also a Gaussian function. However, the function illustrated in FIG. 4A is not exactly Gaussian. Hence, the Fourier transform of the function illustrated in FIG. 4A will not be exactly Gaussian as is illustrated in FIG. 4B. However, it is close enough to significantly reduce proximity effects.

Simple Pupil Function

Figure 5A:
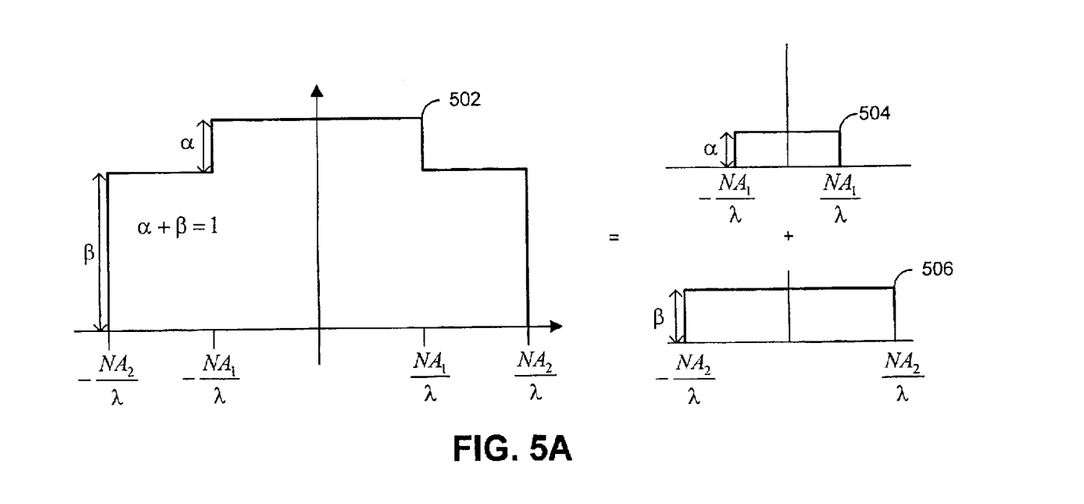
FIG. 5A illustrates another pupil function in accordance with an embodiment of the invention.

FIG. 5A illustrates a simple pupil function 502 for a pupil filter 520 in accordance with an embodiment of the invention. This pupil function 502 results from the pupil filter 520 illustrated in FIG. 5C. The pupil filter 520 illustrated in FIG. 5C includes a concentric ring of a material that attenuates light. A circular region in the center of pupil filter 520 does not attenuate light. Hence, the pupil function 502 has a higher intensity in the range from $-NA_1/\lambda$ to $-NA_1/\lambda$, and a lower intensity in the surrounding regions, from $-NA_1/\lambda$ to $-NA_2/\lambda$ and from $NA_2/\lambda$ to $NA_1/\lambda$. Note that $NA_1$ is the numerical aperture of the inner circle of pupil filter 520, and $NA_2$ is the numerical aperture of the outer circle of pupil filter 520. Also note that pupil function 502 can expressed as the sum of a first pupil function 504 that extends from $-NA_1/\lambda$ to $NA_1/\lambda$, and a second pupil function 506 that extends from $-NA_2/\lambda$ to $NA_2/\lambda$.

Figure 5B:
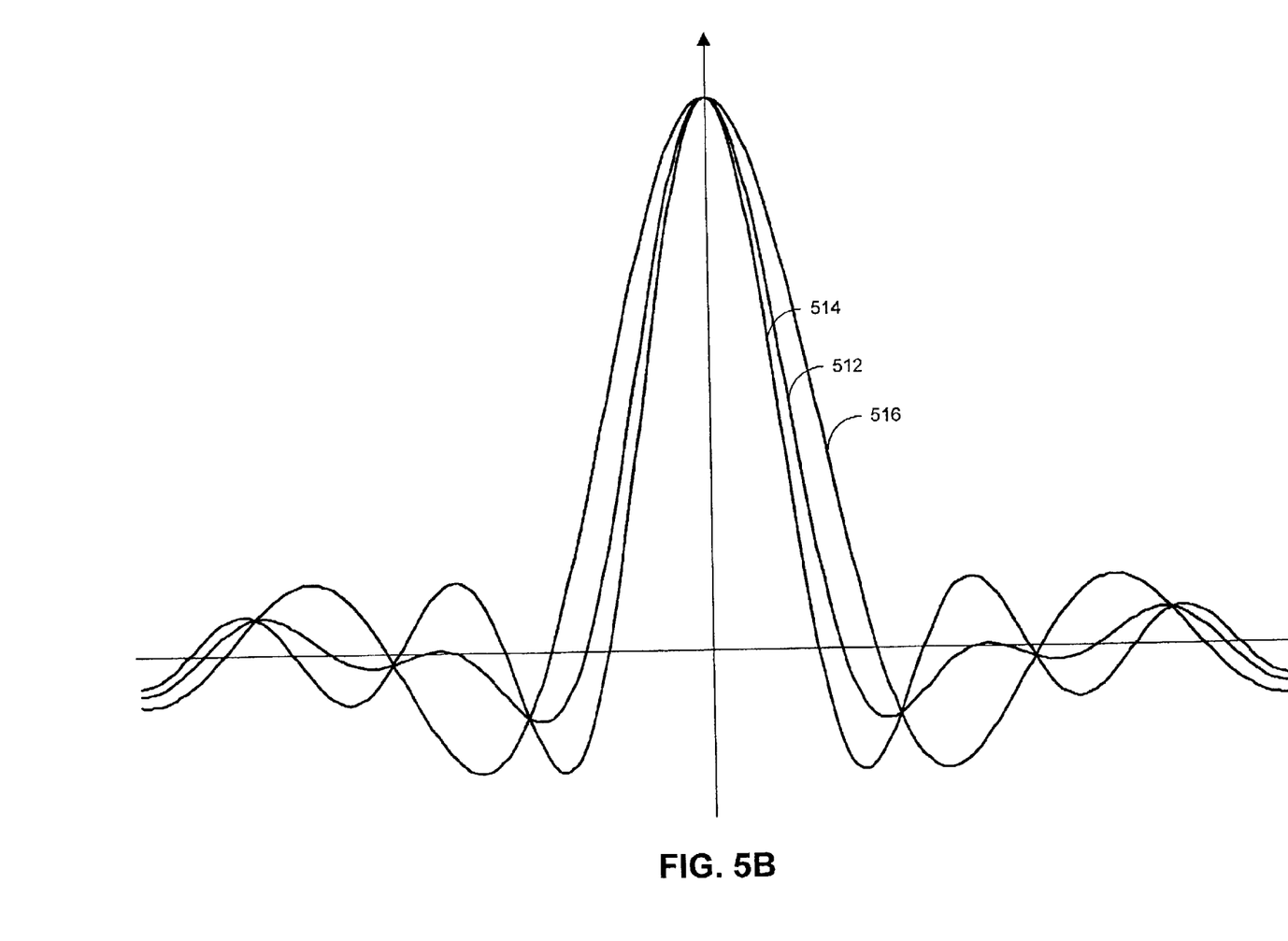
FIG. 5B illustrates a corresponding point-spread function in accordance with an embodiment of the invention.
Figure 5C:
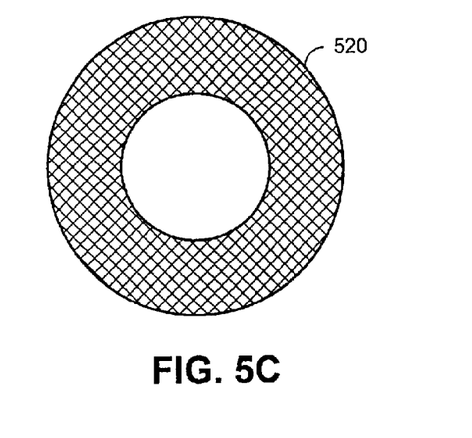
FIG. 5C illustrates the corresponding pupil filter in accordance with an embodiment of the invention.

FIG. 5B illustrates a corresponding point-spread function for pupil function 502 in accordance with an embodiment of the invention. As is illustrated in FIG. 5B, the corresponding point-spread function 512 can be thought of as the sum of the point-spread 514 for pupil function 504 and point-spread function 516 for pupil function 506. During the summing process, the ringing from point-spread function 516 largely cancels the ringing from point-spread function 514. Hence, the resulting point-spread function 512 is largely free from the ringing that causes optical proximity effects.

More Complex Pupil Filter

Figure 6A:
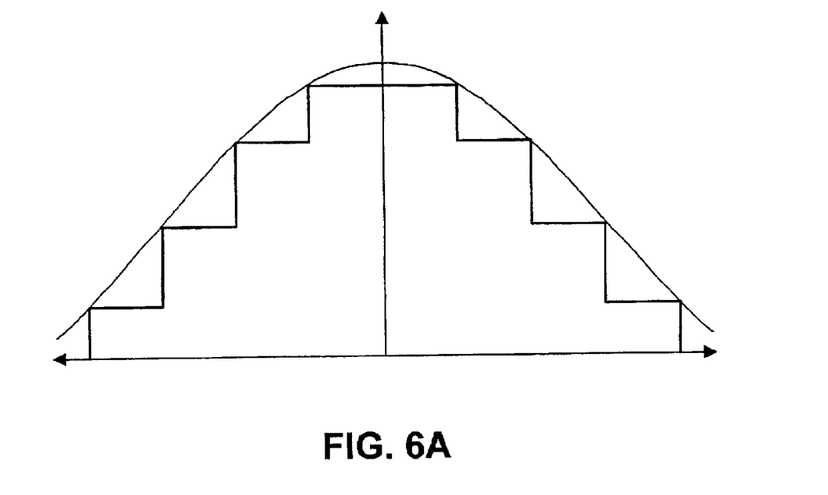
FIG. 6A illustrates yet another pupil function in accordance with an embodiment of the invention.
Figure 6B:
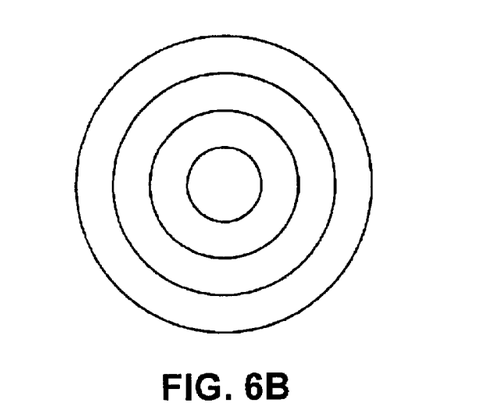
FIG. 6B illustrates the corresponding pupil filter in accordance with an embodiment of the invention.

FIG. 6A illustrates a more complex pupil function for the pupil filter in accordance with an embodiment of the invention. This pupil function is created by a number of concentric rings having attenuation that increases radially are illustrated in FIG. 6B. Note that this pupil function is a step-wise approximation of the Gaussian pupil function illustrated in FIG. 4A.

Process of Applying and Exposing Photoresist Layer

Figure 7:
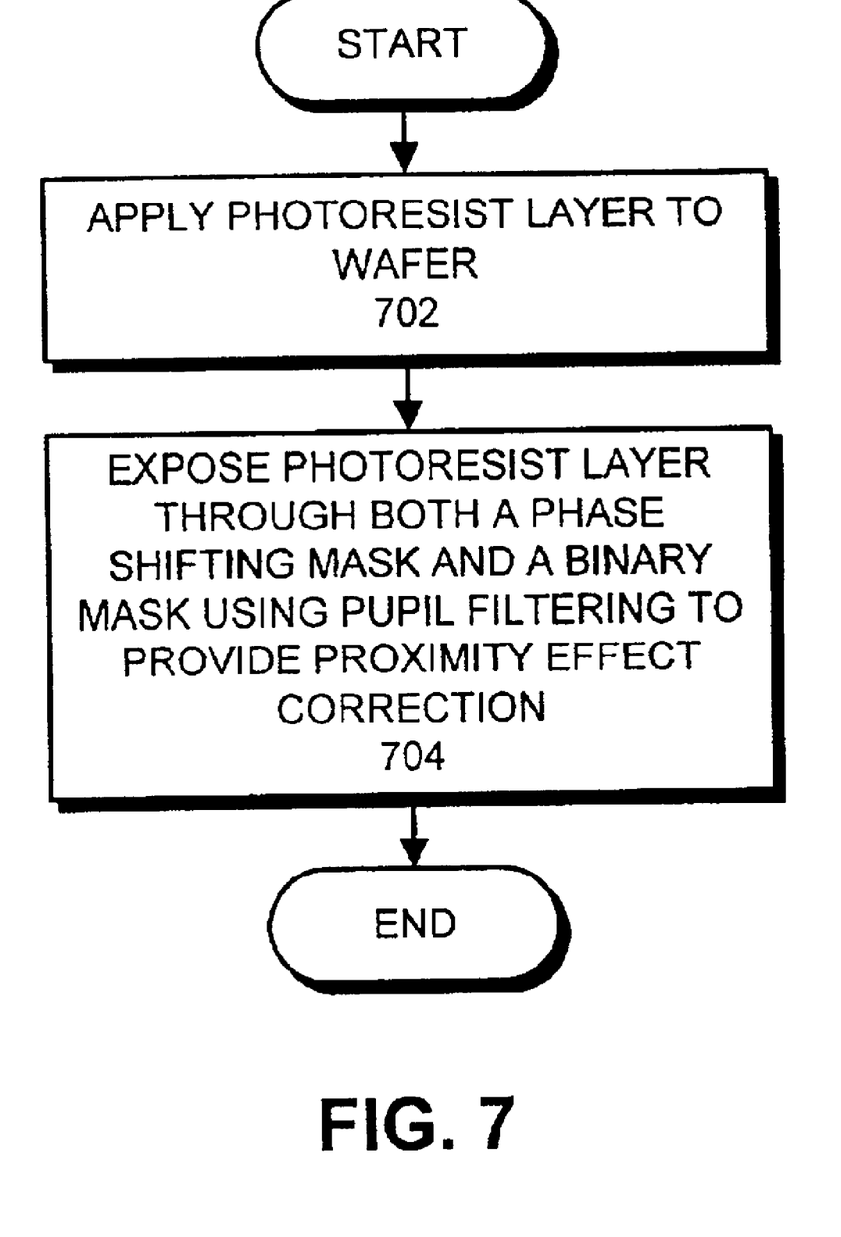
FIG. 7 is a flow chart illustrating the process of applying and exposing the photoresist layer in accordance with an embodiment of the invention.

FIG. 7 is a flow chart illustrating the process of applying and exposing the photoresist layer in accordance with an embodiment of the invention. During operation, the system applies a photoresist layer to a wafer (step 702). Next, the system exposes the photoresist layer through both a phase shifting mask and a binary mask (step 704) as part of a double exposure process, wherein the double exposure process uses pupil filtering to provide proximity effect correction as is described above. (Note that pupil filtering can also be used for printing other layers where only a single exposure is used. Hence, step 704 does not require use of both a binary mask and phase shifting mask.)

Alternative Embodiments

The foregoing descriptions of embodiments of the invention have been presented only for purposes of illustration and description. They are not intended to be exhaustive or to limit the invention to the forms disclosed. Accordingly, many modifications and variations will be apparent. Additionally, the above disclosure is not intended to limit the invention. The scope of the invention is defined by the appended claims.

For example, the invention is not limited the exemplary pupil functions illustrated in FIGS. 4A, 5A and 6A. In general, the invention can use any pupil function that reduces optical proximity effects.

Moreover, the data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet and the computer instruction signals may include the programs being accessed across the network.

Note that a specification for a pupil filter can be stored in a conventional format for representing a mask, such as GDSII stream format. Furthermore, a pupil filter can be manufactured using a process that is similar to conventional processes for manufacturing masks.

Figure 8A:
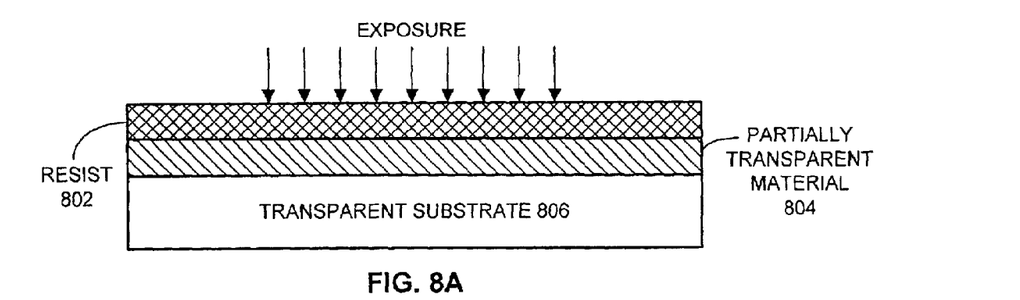
FIG. 8A illustrates a step in the fabrication of a pupil filter in accordance with an embodiment of the invention.

Also, note that a multi-step fabrication process illustrated in can be used to achieve a multi-step transmission function. Referring to FIG. 8A, a resist layer is deposited over a partially transparent material 804 that is bonded to a transparent substrate 806.

Figure 8B:
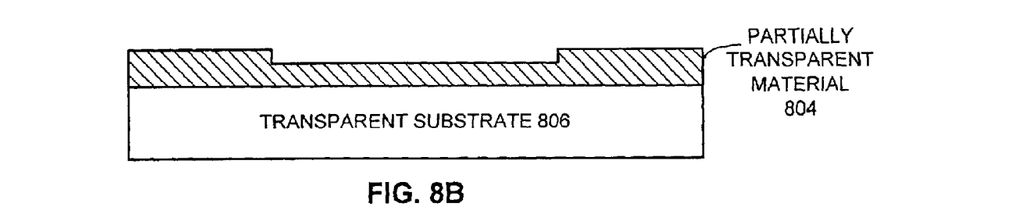
FIG. 8B illustrates another step in the fabrication of a pupil filter in accordance with an embodiment of the invention.

Next, a circular region of resist layer 802 is exposed through a first mask, and is then developed to form a pattern which is used to selectively etch away a layer of partially transparent material 804 as is illustrated in FIG. 8B.

Figure 8C:
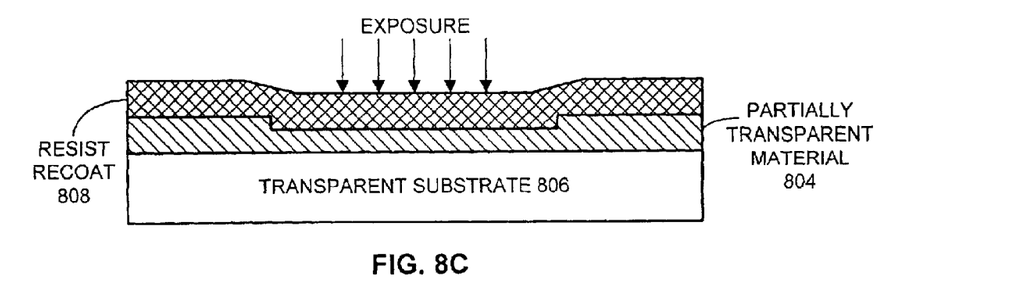
FIG. 8C illustrates yet another step in the fabrication of a pupil filter in accordance with an embodiment of the invention.

A resist recoat 808 is then applied over the etched surface of partially transparent material 804 and a smaller radius circular region of resist recoat 308 is exposed through a second mask as is illustrated in FIG. 8C.

Figure 8D:
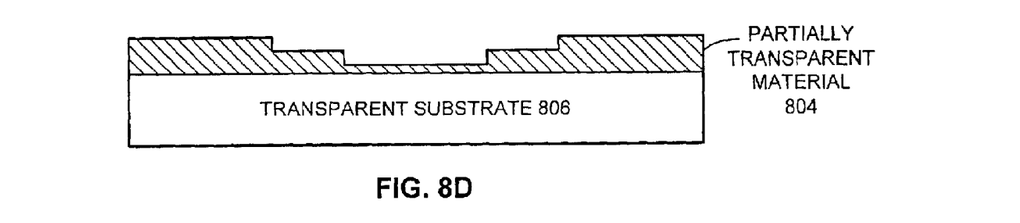
FIG. 8D illustrates a completed pupil filter in accordance with an embodiment of the invention.

Resist recoat 808 is then developed to form a pattern which is used to selectively etch away another layer of partially transparent material 804 as is illustrated in FIG. 8D.

After this process is complete, partially transparent material 804 has thinner circular region in the center, which is surrounded by two concentric rings of increasing thickness.

Conclusion

The preceding description is presented to enable one to make and use the invention, and is provided in the context of a particular application and its requirements. Various modifications to the disclosed embodiments will be readily apparent, and the general principles defined herein may be applied to other embodiments and applications without departing from the spirit and scope of the invention. Thus, the invention is not limited to the embodiments shown, but is to be accorded the widest scope consistent with the principles and features disclosed herein.

What is claimed is:

1. A method for using pupil filtering to mitigate optical proximity effects that arise during an optical lithography process for manufacturing an integrated circuit, comprising:
    applying a photoresist layer to a wafer; and
    exposing the photoresist layer through a mask;
    wherein exposing the photoresist layer involves performing pupil filtering, wherein a pupil filtering occurs in a single exposure using a single pupil filter that is symmetric with respect to the pupil center;

wherein the pupil filtering corrects for optical proximity effects caused by an optical system used to expose the photoresist layer.

2. The method of claim 1, wherein the pupil filtering introduces phase variations into the pupil of the optical system that is used to expose the photoresist layer.

3. The method of claim 1,
wherein the pupil filtering introduces attenuation into a pupil of an optical system that is used to expose the photoresist layer; and
wherein the attenuation varies radially from the center of the pupil to provide proximity effect correction for a printed image on the wafer.

4. The method of claim 3, wherein the attenuation increases with radial distance from the center of the pupil.

5. The method of claim 4, wherein the attenuation increases with radial distance to achieve a Gaussian intensity apodization.

6. The method of claim 1, wherein the pupil filtering is accomplished by providing filtering in a concentric ring surrounding the center of the pupil to cancel out ringing effects caused by edges of the pupil.

7. The method of claim 1, wherein the pupil filtering additionally compensates for resist effects.

8. The method of claim 1, wherein the exposure is part of an alternating aperture phase shift mask (PSM) process.

9. An apparatus that uses pupil filtering to mitigate optical proximity effects that arise during an optical lithography process for manufacturing an integrated circuit, comprising:
an exposure mechanism that is configured to expose a photoresist layer on a wafer through a mask using a single exposure;
an optical system within the exposure mechanism; and
a single pupil filter within the optical system that is symmetric with respect to the pupil center;
wherein the pupil filtering corrects for optical proximity effects caused by the optical system used to expose the photoresist layer.

10. The apparatus of claim 9, wherein the pupil filtering introduces phase variations into the pupil of the optical system that is used to expose the photoresist layer.

11. The apparatus of claim 9,
wherein the pupil filter introduces attenuation into a pupil of an optical system; and
wherein the attenuation varies radially from the center of the pupil to provide proximity effect correction for a printed image on the wafer.

12. The apparatus of claim 11, wherein the attenuation increases with radial distance from the center of the pupil.

13. The apparatus of claim 12, wherein the attenuation increases with radial distance to achieve a Gaussian intensity apodization.

14. The apparatus of claim 9, wherein the pupil filter is configured to provide filtering in a concentric ring surrounding the center of the pupil to cancel out ringing effects caused by edges of the pupil.

15. The apparatus of claim 9, wherein the pupil filter additionally compensates for resist effects.

16. The apparatus of claim 9, wherein the apparatus is part of a system that performs an alternating aperture phase shift mask (PSM) process.

17. An optical system that uses pupil filtering to mitigate optical proximity effects that arise during an optical lithography process for manufacturing an integrated circuit, comprising:
the optical system that is used to expose a photoresist layer on a wafer through a mask using a single exposure; and
a single pupil filter within the optical system that is symmetric with respect to the pupil center;
wherein the pupil filtering corrects for optical proximity effects caused by the optical system used to expose the photoresist layer.

18. The optical system of claim 17, wherein the pupil filtering introduces phase variations into the pupil of the optical system that is used to expose the photoresist layer.

19. The optical system of claim 17,
wherein the pupil filter introduces attenuation into a pupil of an optical system;
wherein the attenuation varies radially from the center of the pupil to provide proximity effect correction for a printed image on the wafer.

20. The optical system of claim 19, wherein the attenuation increases with radial distance from the center of the pupil.

21. The optical system of claim 20, wherein the attenuation increases with radial distance to achieve a Gaussian intensity apodization.

22. The optical system of claim 17, wherein the pupil filter is configured to provide filtering in a concentric ring surrounding the center of the pupil to cancel out ringing effects caused by edges of the pupil.

23. The optical system of claim 17, wherein the pupil filter additionally compensates for resist effects.

24. The optical system of claim 17, wherein the optical system is part of a system that performs an alternating aperture phase shift mask (PSM) process.

25. A means for using pupil filtering to mitigate optical proximity effects that arise during an optical lithography process for manufacturing an integrated circuit, comprising:
an exposure means for exposing a photoresist layer on a wafer through a mask using a single exposure; and
a single pupil filtering means within the exposure means that is symmetric with respect to the center of the pupil filtering means;
wherein the pupil filtering corrects for optical proximity effects caused by an optical system used to expose the photoresist layer.

26. A method for manufacturing an integrated circuit that uses pupil filtering to mitigate optical proximity effects that arise during optical lithography, the method comprising:
applying a photoresist layer to a wafer;
exposing the photoresist layer through a mask;
wherein exposing the photoresist layer involves performing pupil filtering, wherein the pupil filtering occurs in a single exposure using a single pupil filter that is symmetric with respect to the pupil center;
wherein the pupil filtering corrects for optical proximity effects caused by an optical system used to expose the photoresist layer; and
developing the photoresist layer.

27. The method of claim 26, wherein the pupil filtering introduces phase variations into the pupil of the optical system that is used to expose the photoresist layer.

28. The method of claim 26,
wherein the pupil filtering introduces attenuation into a pupil of an optical system that is used to expose the photoresist layer; and
wherein the attenuation varies radially from the center of the pupil to provide proximity effect correction for a printed image on the wafer.

29. A pupil filter that mitigates optical proximity effects that arise during an optical lithography process for manufacturing an integrated circuit, comprising:

a single pupil filter that is symmetric with respect to the pupil center for use within a pupil of an optical system used to expose the photoresist layer in a single exposure during the optical lithography process;

wherein the pupil filtering corrects for optical proximity effects caused by the optical system.

30. The pupil filter of claim 29, wherein the pupil filtering introduces phase variations into the pupil of the optical system that is used to expose the photoresist layer.

31. The pupil filter of claim 29, wherein the pupil filter introduces attenuation into a pupil of an optical system; and wherein the attenuation varies radially from the center of the pupil to provide proximity effect correction for a printed image on the wafer.

* * * * *